United States Patent
Hung et al.

(10) Patent No.: US 9,871,035 B2
(45) Date of Patent: Jan. 16, 2018

(54) SEMICONDUCTOR DEVICE WITH METAL SILICIDE BLOCKING REGION AND METHOD OF MANUFACTURING THE SAME

(71) Applicant: Taiwan Semiconductor Manufacturing Co., Ltd., Hsin-Chu (TW)

(72) Inventors: I-Hsiang Hung, New Taipei (TW); Wei-Der Sun, Hsinchu (TW); Ching-Chen Hao, Zhubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 67 days.

(21) Appl. No.: 14/144,953

(22) Filed: Dec. 31, 2013

(65) Prior Publication Data
US 2015/0187756 A1  Jul. 2, 2015

(51) Int. Cl.
| | | |
|---|---|---|
| *H01L 27/12* | (2006.01) | |
| *H01L 27/06* | (2006.01) | |
| *H01L 21/8234* | (2006.01) | |
| *H01L 49/02* | (2006.01) | |
| *H01L 29/08* | (2006.01) | |
| *H01L 21/265* | (2006.01) | |
| *H01L 21/28* | (2006.01) | |

(Continued)

(52) U.S. Cl.
CPC .... *H01L 27/0629* (2013.01); *H01L 21/26506* (2013.01); *H01L 21/28052* (2013.01); *H01L 21/28518* (2013.01); *H01L 21/823418* (2013.01); *H01L 21/823443* (2013.01); *H01L 28/20* (2013.01); *H01L 29/0847* (2013.01); *H01L 29/665* (2013.01)

(58) Field of Classification Search
CPC ............... H01L 27/0629; H01L 28/20; H01L 21/823814; H01L 23/5256; H01L 21/28097; H01L 21/823835; H01L 21/28052
USPC ....... 257/350, 358, 360, 363, 364, 379, 380, 257/413, 516
See application file for complete search history.

(56) References Cited

U.S. PATENT DOCUMENTS

| | | | | |
|---|---|---|---|---|
| 6,599,831 B1 * | 7/2003 | Maszara | ........... | H01L 21/28097 257/E21.165 |
| 7,429,526 B1 * | 9/2008 | Nayak | ............... | H01L 21/28097 257/E21.203 |

(Continued)

OTHER PUBLICATIONS

WebElements, Carbon/Germanium: radii of atoms and ions.*

*Primary Examiner* — David Chen
(74) *Attorney, Agent, or Firm* — Birch, Stewart, Kolasch & Birch, LLP (57) ABSTRACT

Embodiments of mechanisms for forming a semiconductor device are provided. The semiconductor device includes a gate stack on a semiconductor substrate. In some embodiments, the semiconductor device further includes a semiconductor element, such as for example, a resistor, on the semiconductor substrate. The semiconductor device includes a metal silicide layer on at least one of the gate stack, the source region, and the drain region. The semiconductor device also includes a blocking region in a portion of the semiconductor element. In some embodiments, the blocking region includes first dopants and second dopants with an atomic radius smaller than that of the first dopants.

20 Claims, 5 Drawing Sheets

(51) Int. Cl.
*H01L 29/66* (2006.01)
*H01L 21/285* (2006.01)

(56) References Cited

U.S. PATENT DOCUMENTS

| | | | |
|---|---|---|---|
| 2006/0035426 A1* | 2/2006 | Weiss | H01L 23/5228 438/199 |
| 2006/0252239 A1 | 11/2006 | Hierlemann | |
| 2010/0193867 A1* | 8/2010 | Yan | H01L 23/5256 257/355 |
| 2010/0328022 A1* | 12/2010 | Fan | H01L 27/0629 338/309 |
| 2011/0073956 A1 | 3/2011 | Heinrich et al. | |
| 2012/0049291 A1 | 3/2012 | Scheiper et al. | |
| 2013/0200466 A1* | 8/2013 | Zhao et al. | 257/380 |
| 2013/0203226 A1* | 8/2013 | Yang | H01L 27/0629 438/238 |

\* cited by examiner

SEMICONDUCTOR DEVICE WITH METAL SILICIDE BLOCKING REGION AND METHOD OF MANUFACTURING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, the processes of a device may adversely affect the performance of other adjacent devices. Therefore, it is a challenge to avoid adversely affecting the performance of other adjacent devices.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
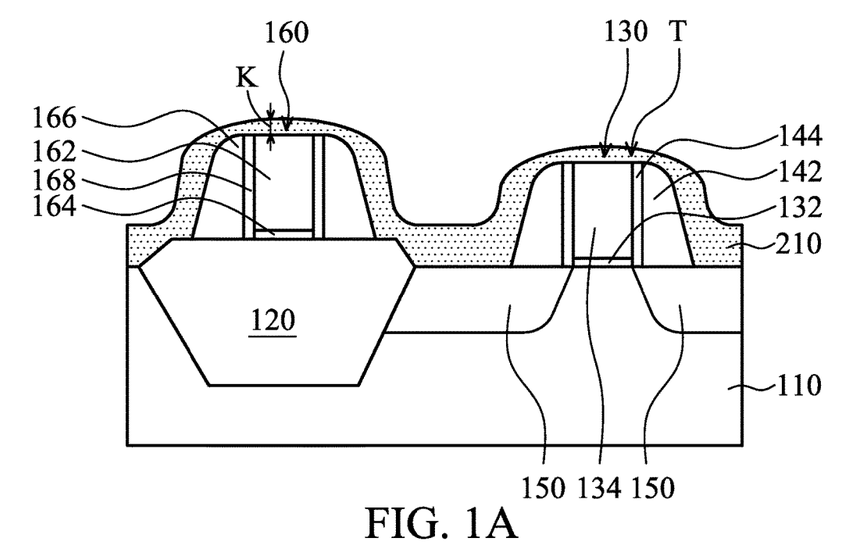
FIGS. 1A-1G are cross-sectional views of various stages of a process for forming a semiconductor device, in accordance with some embodiments.

FIGS. 1A-1G are cross-sectional views of various stages of a process for forming a semiconductor device 100, in accordance with some embodiments. As shown in FIG. 1A, a semiconductor substrate 110 is provided. The semiconductor substrate 110 is a semiconductor wafer (such as a silicon wafer) or a portion of a semiconductor wafer, in accordance with some embodiments.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The semiconductor substrate 110 also includes multi-layer semiconductors, semiconductor on insulator (SOI) (such as silicon on insulator or germanium on insulator), or combinations thereof, in accordance with some embodiments.

An isolation structure 120 is formed in the semiconductor substrate 110 to define various active regions in the semiconductor substrate 110, and to electrically isolate neighboring devices (e.g. transistors) from one another. The isolation structure 120 is made of a dielectric material, such as silicon oxide, silicon nitride, silicon oxynitride, fluoride-doped silicate glass (FSG), a low-K dielectric material, other suitable materials, or combinations thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by a photolithography process, etching a trench in the semiconductor substrate 110 (for example, by using a dry etching, wet etching, or plasma etching process, or combinations thereof), and filling the trench (for example, by using a chemical vapor deposition process) with the dielectric material. In some embodiments, the filled trench has a multi-layer structure, such as a thermal oxide liner layer filled with silicon nitride or silicon oxide.

As shown in FIG. 1A, a gate stack 130 is formed over the semiconductor substrate 110 for defining active regions in the semiconductor substrate 110. The gate stack 130 includes a gate dielectric layer 132 and a gate electrode 134 formed on the gate dielectric layer 132. The gate dielectric layer 132 is made of silicon oxide, silicon oxynitride, a high dielectric constant material (high-k material), or combinations thereof. The gate electrode 134 may be made of polysilicon, other silicon-containing materials or other suitable gate materials, in accordance with some embodiments.

Spacers 142 are formed over sidewalls of the gate stack 130. The spacers 142 are made of a dielectric material, such as silicon nitride layer, silicon oxynitride layer, or combinations thereof, in accordance with some embodiments. In some embodiments, a sealing layer 144 is formed between the spacers 142 and the gate stack 130. The sealing layer 144 is made of a dielectric layer (e.g., a silicon nitride), in accordance with some embodiments.

Doped regions 150 are formed in the semiconductor substrate 110 by using a suitable process, such as an ion implantation process, in accordance with some embodiments. The doped regions 150 are a heavily doped source region and a heavily doped drain region, which may be formed after the spacers 142 are formed, in accordance with some embodiments. The gate stack 130, the spacers 142, the sealing layer 144 and the doped regions 150 constitute a transistor T, in accordance with some embodiments.

A semiconductor element (such as a resistor 160 or other semiconductor elements needing to avoid forming metal silicides thereon or therein) is formed over the semiconductor substrate 110, in accordance with some embodiments. The resistor 160 is formed over the isolation structure 120, in accordance with some embodiments. The resistor 160 includes a silicon material. The silicon material includes, for example, a polysilicon. In some embodiments, the resistor 160 includes a bulk polysilicon 162. In some embodiments, the resistor 160 has a structure similar to that of the gate stack 130. The resistor 160 includes the bulk polysilicon 162 and a dielectric layer 164. The bulk polysilicon 162 and the gate electrode 134 are formed in the same deposition process, and the dielectric layer 164 and the gate dielectric layer 132 are formed in the same deposition process, in accordance with some embodiments. The dielectric layer 164 and the gate dielectric layer 132 have the same materials, in accordance with some embodiments.

The resistor 160 further includes spacers 166 formed over sidewalls of the bulk polysilicon 162 and the dielectric layer 164, in accordance with some embodiments. The spacers 166 are made of a dielectric material, such as silicon nitride layer, silicon oxynitride layer, or combinations thereof, in accordance with some embodiments. The resistor 160 optionally includes a sealing layer 168 formed between the spacers 166 and the bulk polysilicon 162 and the dielectric layer 164. The sealing layer 168 is made of a dielectric layer (e.g., a silicon nitride), in accordance with some embodiments.

As shown in FIG. 1A, a buffer layer 210 is formed over the semiconductor substrate 110 by using, for example, a chemical vapor deposition process. The buffer layer 210 covers the transistor T, the resistor 160 and the isolation structure 120. The buffer layer 210 is configured to buffer subsequent implantation processes. The buffer layer 210 includes oxides (e.g. $SiO_2$) and nitrides (e.g. SiN), in accordance with some embodiments. In some embodiments, a thickness K of the buffer layer 210 ranges from about 150 Å to about 200 Å.

Figure 1B:
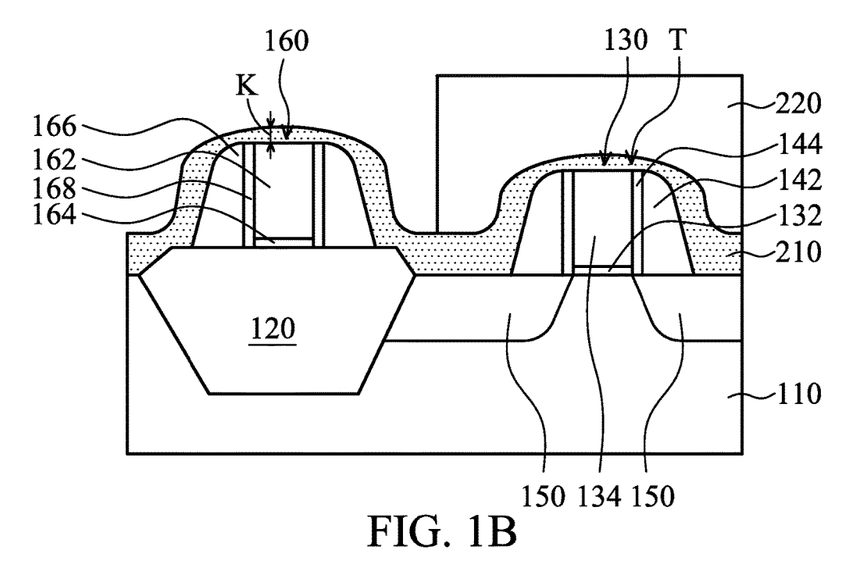

Afterwards, as shown in FIG. 1B, a mask layer 220 is formed on a portion of the buffer layer 210 covering the transistor T. The mask layer 220 is configured to shield the transistor T from dopants during subsequent implantation processes. In some embodiments, the mask layer 220 is a photoresist layer.

Figure 1C:
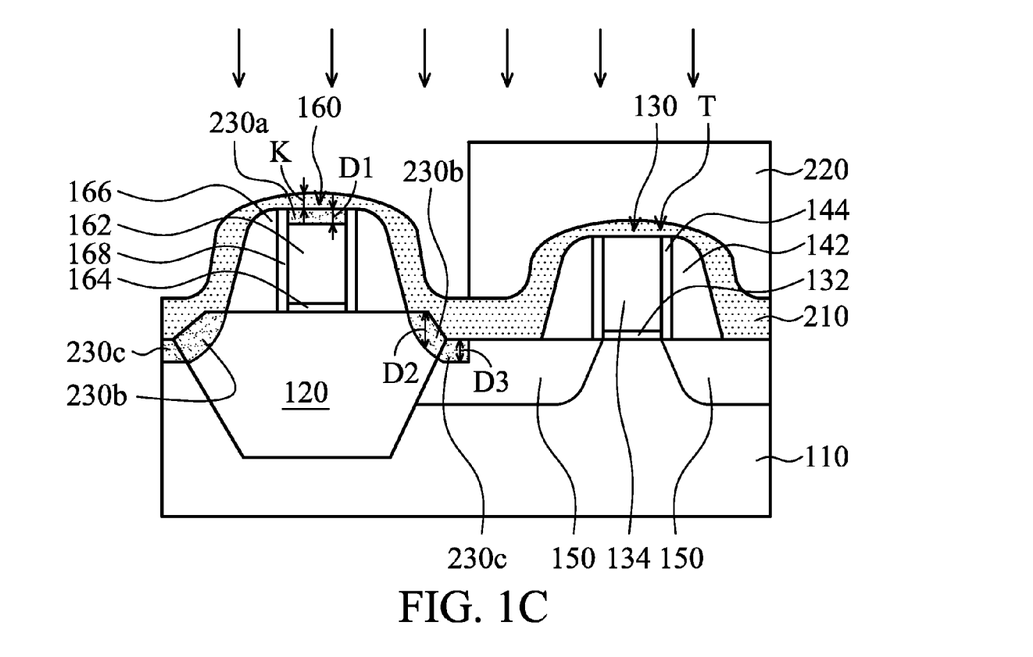

Thereafter, as shown in FIG. 1C, a first implantation process is performed to implant first dopants into top portions of the bulk polysilicon 162 and the isolation structure 120. In some embodiments, the first dopants include germanium or other suitable materials. The first implantation process includes a germanium implantation process, in accordance with some embodiments.

A second implantation process is then performed to implant second dopants into the top portions of the bulk polysilicon 162 and the isolation structure 120. The second dopants have an atomic radius smaller than that of the first dopants. In some embodiments, the second dopants include carbon or other suitable materials. The second implantation process includes a carbon implantation process, in accordance with some embodiments.

In the first implantation process and the second implantation process, the buffer layer 210 is used to control the dopant depth and the dopant concentration by selecting the material and the thickness K of the buffer layer 210, in accordance with some embodiments.

The first implantation process and the second implantation process form blocking regions 230a and 230b in the top portions of the bulk polysilicon 162 and the isolation structure 120, in accordance with some embodiments. In some embodiments, the first implantation process and the second implantation process further form blocking regions 230c in the top portions of the semiconductor substrate 110 adjacent to the isolation structure 120. Each of the blocking regions 230a, 230b and 230c contains the first dopants and the second dopants. The blocking region 230b is adjacent to the resistor 160, in accordance with some embodiments. In some embodiments, the blocking region 230c is adjacent to the isolation structure 120.

In some embodiments, the first dopants (e.g. germanium) implanted first and with a larger radius block the second dopants (e.g. carbon) implanted thereafter and with a smaller radius within the blocking regions 230a, 230b and/or 230c. The second dopants are aggregated on or adjacent to the top surfaces of the bulk polysilicon 162, the isolation structure 120 and/or the semiconductor substrate 110, in accordance with some embodiments.

By adjusting the implantation energies and dosages of the first and second implantation processes, the first and second dopants in the blocking regions 230a, 230b and 230c block the diffusion of metal atoms during subsequent metal silicide processes, in accordance with some embodiments. Therefore, the first dopants and the second dopants prevent the metal atoms from contacting and reacting with the bulk polysilicon 162, the isolation structure 120 and the semiconductor substrate 110 in and/or under the blocking regions 230a, 230b and 230c, in accordance with some embodiments.

In some embodiments, the blocking regions 230a, 230b and 230c are also referred to as metal silicide blocking regions. The metal silicide blocking regions block metal silicides from forming in the bulk polysilicon 162, the isolation structure 120 and the semiconductor substrate 110 in and/or under the blocking regions 230a, 230b and 230c, in accordance with some embodiments. In some embodiments, if metal silicides are formed in the resistor 160, the resistance of the resistor 160 is decreased. Therefore, the blocking regions 230a, 230b and 230c help the resistor 160 to maintain the resistance in a suitable range.

In some embodiments, the implantation energy of the first implantation process ranges from about 10 keV to about 40 keV. In some embodiments, the implantation energy of the first implantation process ranges from about 20 keV to about 30 keV. In some embodiments, the first dopant implantation dosage of the first implantation process ranges from about $1E14$ $cm^{-2}$ to about $1E16$ $cm^{-2}$.

In some embodiments, the implantation energy of the second implantation process ranges from about 1 keV to about 15 keV. In some embodiments, the implantation energy of the second implantation process ranges from about 5 keV to about 10 keV. In some embodiments, the second dopant implantation dosage of the second implantation process ranges from about $1E14$ $cm^{-2}$ to about $1E16$ $cm^{-2}$.

In some embodiments, the implantation energy of the first implantation process is larger than the implantation energy of the second implantation process. In some embodiments, the difference in implantation energy between the first implantation process and the second implantation process ranges from about 9 keV to about 39 keV. In some embodiments, the difference in implantation energy between the first implantation process and the second implantation process ranges from about 9 keV to about 25 keV.

In some embodiments, the ratio of the implantation energy of the first implantation process to that of the second implantation process ranges from about 0.67 to about 40. In some embodiments, the ratio of the implantation energy of the first implantation process to that of the second implantation process ranges from about 2.37 to about 10.

One of the dopant depths D1, D2 and D3 of the blocking regions 230a, 230b and 230c is below about 20 Å, in accordance with some embodiments. In some embodiments, the second dopant concentration of the blocking regions 230a, 230b or 230c ranges from about 1E13 cm$^{-3}$ to about 1E16 cm$^{-3}$. For example, the second dopant concentration of the blocking regions 230a, 230b or 230c ranges from about 1E14 cm$^{-3}$ to about 1E16 cm$^{-3}$.

In some embodiments, the first dopant concentration of the blocking regions 230a, 230b or 230c ranges from about 1E13 cm$^3$ to about 1E16 cm$^{-3}$. For example, the first dopant concentration of the blocking regions 230a, 230b or 230c ranges from about 1E14 cm$^{-3}$ to about 1E16 cm$^{-3}$.

In some embodiments, each of the blocking regions 230a, 230b or 230c further contains one or more of boron, fluorine, and arsenic. In some embodiments, the buffer layer 210 is not needed.

Figure 1D:
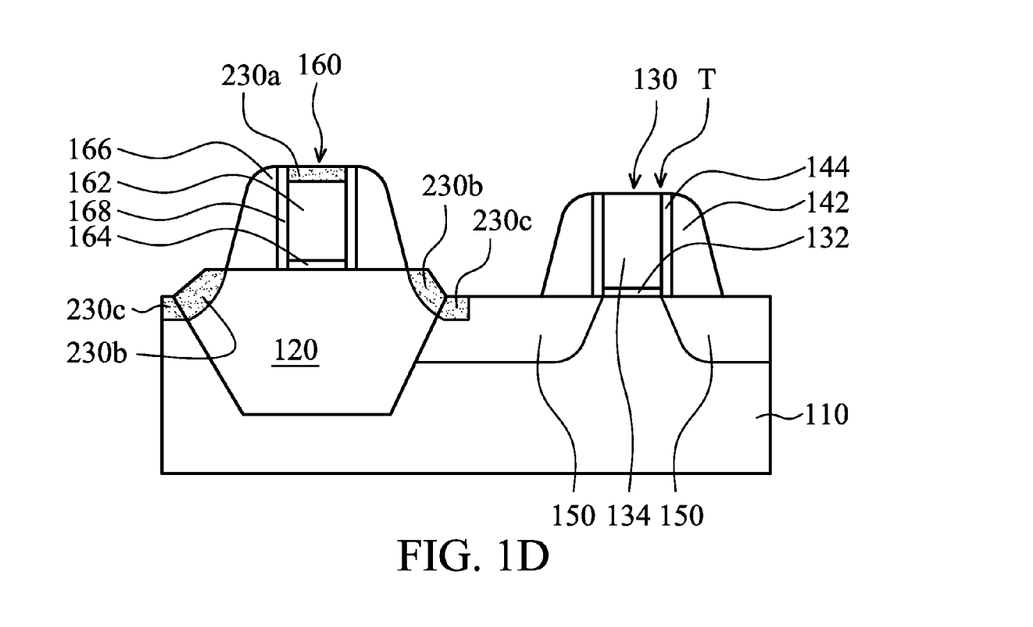

Afterwards, as shown in FIG. 1D, the mask layer 220 and the buffer layer 210 are removed. The buffer layer 210 is removed by, for example, a wet etching process. In the present embodiments, since the buffer layer 210 is removed only by a wet etching process without using a dry etching process, the transistor T is prevented from being damaged by the dry etching process, and the manufacturing cost is decreased.

Figure 1E:
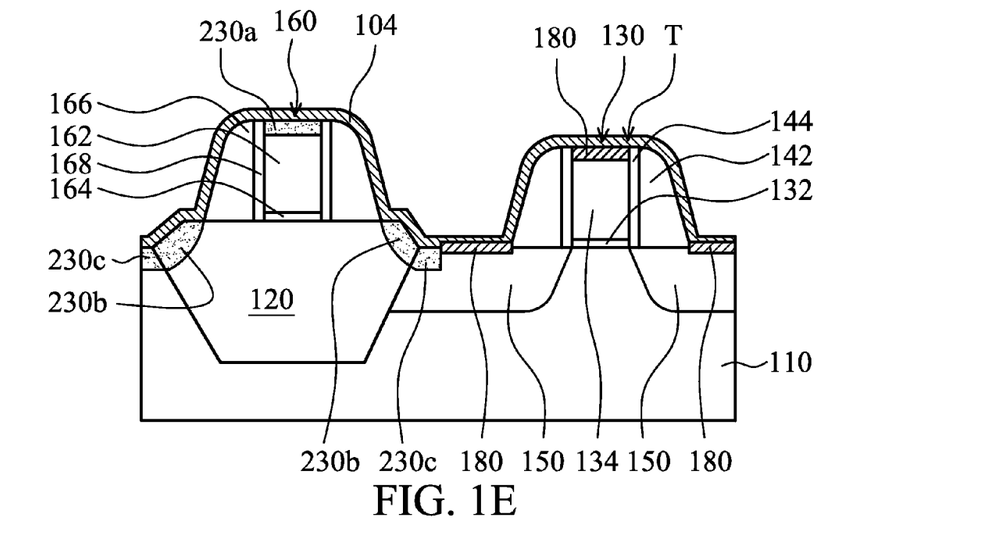
Figure 1F:
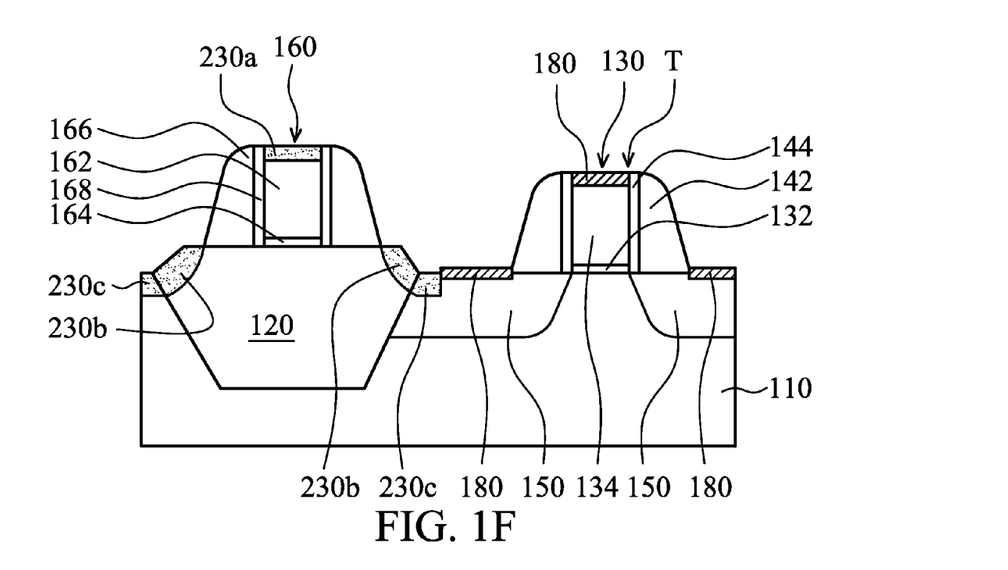

Thereafter, a metal silicide process is performed (as shown in FIGS. 1E and 1F). As shown in FIG. 1E, a metal layer 104 is formed on the semiconductor substrate 110 by using, for example, a physical vapor deposition process. The metal layer 104 includes, for example, nickel, cobalt, titanium, or the like. The doped regions 150 and the gate electrode 134 directly contact the metal layer 104, in accordance with some embodiments. Afterwards, an annealing process is performed to form a metal silicide layer 180 between the metal layer 104 and the doped regions 150 and/or between the metal layer 104 and the gate electrode 134, in accordance with some embodiments. The blocking region 230c is adjacent to the metal silicide layer 180, in accordance with some embodiments.

In some embodiments, the first dopants and the second dopants in the blocking regions 230a, 230b and 230c isolate the metal layer 104 from the bulk polysilicon 162, the isolation structure 120 and/or a portion of the semiconductor substrate 110 in and/or under the blocking regions 230a, 230b and 230c, respectively. Therefore, the first dopants and the second dopants prevent metal silicides from forming in (or on) the bulk polysilicon 162, the isolation structure 120 and/or a portion of the semiconductor substrate 110 under the blocking regions 230a, 230b and 230c, respectively, in accordance with some embodiments.

Figure 1G:
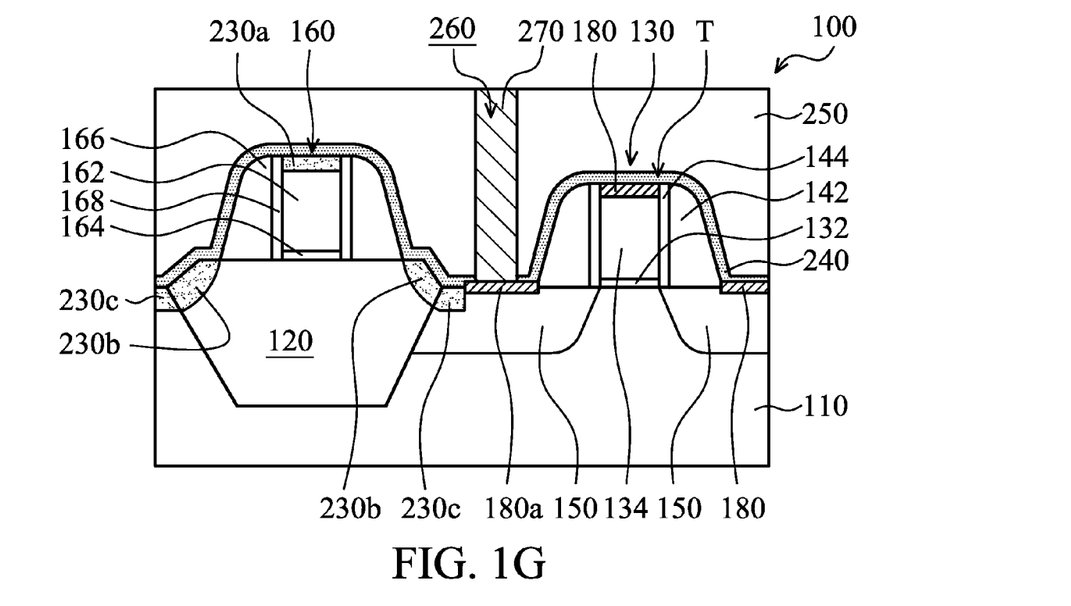

Thereafter, as shown in FIG. 1F, the metal layer 104 unreacted with the semiconductor substrate 110 and the gate electrode 134 is removed. Then, as shown in FIG. 1G, a contact etch stop layer 240 is deposited over the semiconductor substrate 110 by using, for example, a chemical vapor deposition process. The contact etch stop layer 240 covers the transistor T, the resistor 160 and the isolation structure 120. The contact etch stop layer 240 is made of a dielectric material, such as silicon nitride, in accordance with some embodiments. In some other embodiments, the contact etch stop layer 240 is not needed.

As shown in FIG. 1G, an insulating layer 250 is then deposited over the semiconductor substrate 110, in accordance with some embodiments. The insulating layer 250 is made of any suitable insulating material, such as silicon oxynitride, silicon oxide, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The insulating layer 250 is deposited by any suitable process, such as a CVD process, HDPCVD process, spin-on process, sputtering process, or combinations thereof, in accordance with some embodiments.

Thereafter, in some embodiments, the insulating layer 250 and the contact etch stop layer 240 are patterned to form a contact opening 260 exposing a portion 180a of the metal silicide layer 180. Afterwards, in some embodiments, a contact plug 270 is formed in the contact opening 260 to electrically connect the portion 180a of the metal silicide layer 180 and the doped region 150 under the portion 180a of the metal silicide layer 180. The contact plug 270 is made of, for example, tungsten or other suitable conductive materials.

Figure 2:
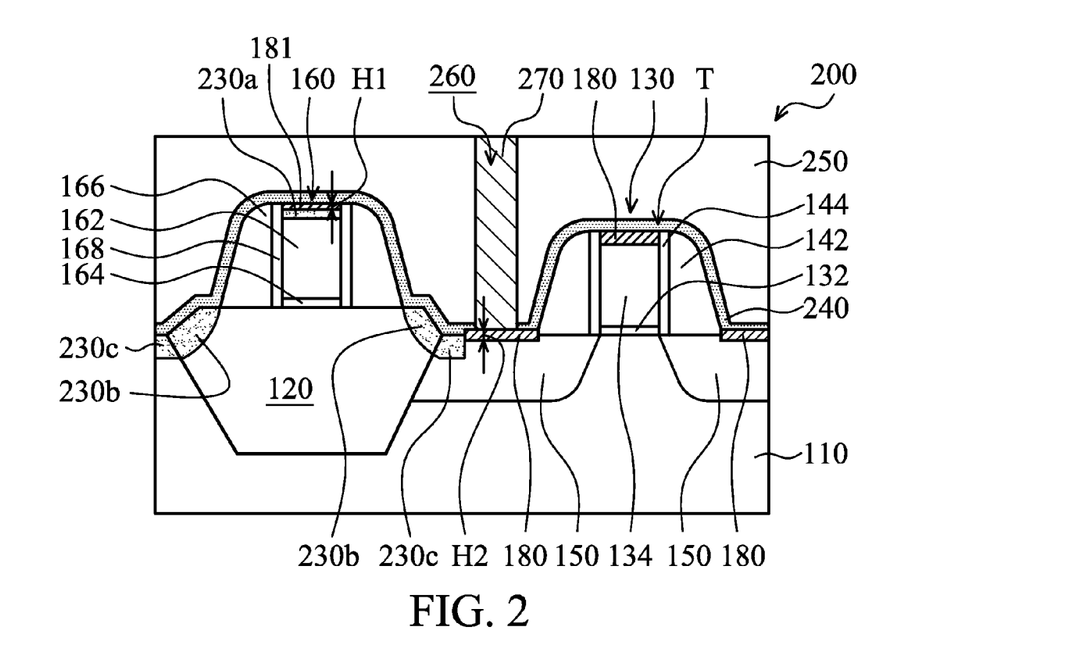
FIG. 2 is a cross-sectional view of a semiconductor device, in accordance with some embodiments.

FIG. 2 is a cross-sectional view of a semiconductor device 200, in accordance with some embodiments. As shown in FIG. 2, in some embodiments, a semiconductor device 200 is similar to the semiconductor device 100 of FIG. 1G, except that the semiconductor device 200 further has a thin metal silicide layer 181 on the blocking region 230a.

In some embodiments, the blocking region 230a reduces the formation of metal silicides on (or in) the bulk polysilicon 162. Therefore, the thickness H1 of the thin metal silicide layer 181 on the blocking region 230a is less than the thickness H2 of the metal silicide layer 180 on the doped regions 150 and the gate electrode 134, in accordance with some embodiments.

As the thickness H1 of the thin metal silicide layer 181 is decreased, the resistance of the resistor 160 is increased as well. Therefore, the resistance of the resistor 160 is able to be adjusted by adjusting the thickness H1 of the thin metal silicide layer 181, in accordance with some embodiments. The thickness H1 of the thin metal silicide layer 181 is adjusted by dopant (or dopant mixture) selection, number of implantation process(es) performed and/or adjusting the implantation energies and dosages of the implantation process(es) (as shown in FIG. 1C and also as described herein), in accordance with some embodiments. In some embodiments, the thickness H1 ranges from about 0.1 nm to about 10 nm. In some embodiments, the thickness H1 ranges from about 0.1 nm to about 5 nm.

Figure 3A:
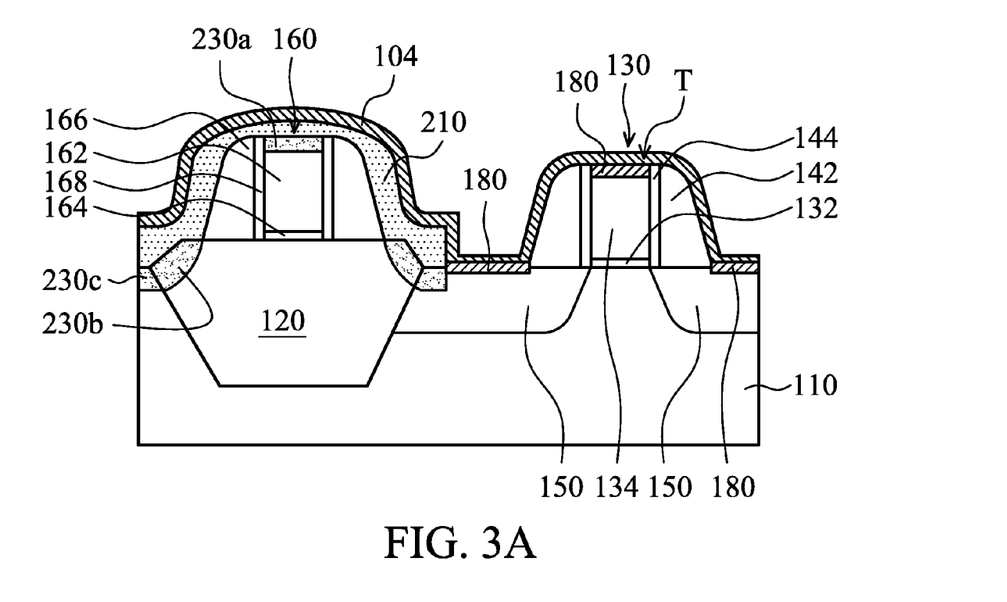
FIGS. 3A-3B are cross-sectional views of various stages of a process for forming a semiconductor device, in accordance with some embodiments.
Figure 3B:
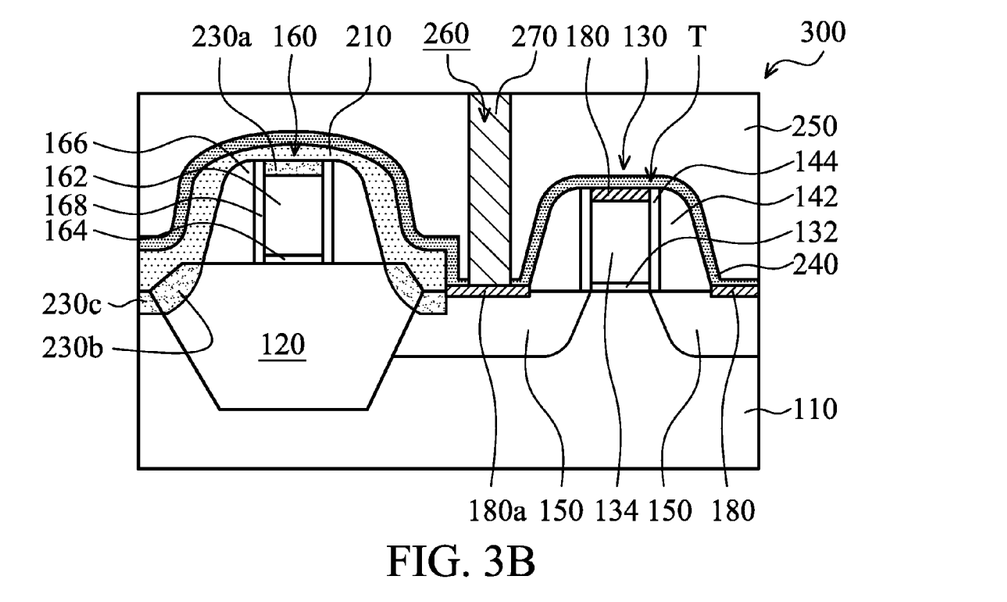

FIGS. 3A-3B are cross-sectional views of various stages of a process for forming a semiconductor device 300, in accordance with some embodiments. In some embodiments, as shown in FIG. 3A, after the step of FIG. 1C, a removal process is performed to remove a portion of the buffer layer 210 covering transistor T. Therefore, the buffer layer 210 only covers the resistor 160 and the isolation structure 120 (and/or a portion of the semiconductor substrate 110).

Thereafter, a metal layer 104 is formed on the semiconductor substrate 110. Afterwards, an annealing process is performed to form a metal silicide layer 180 between the metal layer 104 and the doped regions 150 and between the metal layer 104 and the gate electrode 134.

Then, as shown in FIG. 3B, the metal layer 104 unreacted with the semiconductor substrate 110 and the gate electrode 134 is removed. Afterwards, a contact etch stop layer 240 is deposited over the semiconductor substrate 110. Thereafter, an insulating layer 250 is deposited over the semiconductor substrate 110, in accordance with some embodiments. Afterwards, the insulating layer 250 and the contact etch stop layer 240 are patterned to form a contact opening 260 exposing a portion 180a of the metal silicide layer 180, in accordance with some embodiments. Then, a contact plug 270 is formed in the contact opening 260 to electrically connect the portion 180a of the metal silicide layer 180 and the doped region 150 under the portion 180a of the metal silicide layer 180, in accordance with some embodiments.

In some embodiments, only one implantation process is performed to form the blocking region(s). In some embodiments, the only one implantation process is performed with carbon or germanium as the dopant. In some embodiments, only two implantation processes are performed to form the blocking region(s). In some embodiments, only three implantation processes are performed to form the blocking region(s). In some embodiments at least two implantation processes are performed to form the blocking region(s). In some embodiments, at least one of the blocking regions require fewer implantation process(es) than the other blocking region(s). In some embodiments, at least one of the blocking regions require one fewer implantation process(es) than other blocking region(s). In some embodiments, the implant processes are performed with the same or different dopant(s). In some embodiments, the implantation processes are performed with dopants with successively smaller radius. In some embodiments, the implantation processes are performed with dopant(s) with similar or substantially similar atomic radius.

In some embodiments, a method for forming a semiconductor device includes: forming a semiconductor layer over a substrate, and the semiconductor layer has a first portion and a second portion; implanting one or more dopants into the first portion; forming a metal-containing layer over the semiconductor layer; and forming a metal silicide layer over the semiconductor layer, wherein a thickness of the metal silicide layer over the first portion is less than a thickness of the metal silicide layer over the second portion, or there is no metal silicide layer formed on the first portion. In some embodiments, different dopants are implanted into the first portion. In some embodiments, the different dopants are implanted separately. In some embodiments, the dopants contain one or more atom(s). In some embodiments, the atoms are the same with or different from each other.

Embodiments of mechanisms for forming a semiconductor device described above form a blocking region in a top portion of the semiconductor element, and the blocking region contains first dopants and second dopants with an atomic radius smaller than that of the first dopants. The first dopants and the second dopants are able to block or reduce the diffusion of metal atoms during a metal silicide process, which prevents metal silicides from forming on (or in) the semiconductor element.

In accordance with some embodiments, a semiconductor device is provided. The semiconductor device includes a gate stack on a semiconductor substrate. The semiconductor device also includes a source region and a drain region in the semiconductor substrate and adjacent to the gate stack. The semiconductor device further includes a resistor on the semiconductor substrate, and the resistor includes a silicon material. The semiconductor device includes a metal silicide layer on at least one of the source region, the drain region and the gate stack. The semiconductor device also includes a blocking region in a top portion of the resistor for blocking or reducing the formation of the metal silicide layer on the resistor, and the blocking region includes first dopants and second dopants with an atomic radius smaller than that of the first dopants.

In accordance with some embodiments, a semiconductor device is provided. The semiconductor device includes a gate stack on a semiconductor substrate. The semiconductor device also includes a source region and a drain region in the semiconductor substrate and adjacent to the gate stack. The semiconductor device further includes a semiconductor element on the semiconductor substrate, and the semiconductor element includes a silicon material. The semiconductor device includes a metal silicide layer on at least one of the source region, the drain region and the gate stack. The semiconductor device also includes a blocking region in a top portion of the semiconductor element for blocking or reducing the formation of the metal silicide layer on the semiconductor element. The blocking region includes first dopants and second dopants with an atomic radius smaller than that of the first dopants.

In accordance with some embodiments, a method for forming a semiconductor device is provided. The method includes forming a gate stack and a semiconductor element on a semiconductor substrate, and the semiconductor element includes a silicon material. The method further includes forming a source region and a drain region in the semiconductor substrate and adjacent to the gate stack. The method includes forming a mask layer covering the gate stack, the source region and the drain region. The method also includes performing a first implantation process to implant first dopants into a top portion of the semiconductor element. The method includes performing a second implantation process to implant second dopants into the top portion so as to form a blocking region in the top portion after the first implantation process. The blocking region includes the first dopants and the second dopants with an atomic radius smaller than that of the first dopants. The method includes removing the mask layer and forming a metal silicide layer on at least one of the source region, the drain region and the gate stack.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
   a gate stack on a semiconductor substrate;
   a source region and a drain region in the semiconductor substrate and adjacent to the gate stack;
   a resistor on the semiconductor substrate, wherein the resistor comprises a silicon material;
   a first metal silicide layer in the gate stack, the source region, and the drain region;
   a first blocking region in a top portion of the resistor, wherein the first blocking region comprises first dopants and second dopants with an atomic radius smaller than that of the first dopants, each of a top portion of the gate stack that is directly below the first metal silicide layer, a top portion of the source region that is directly below the first metal silicide layer, and a top portion of the drain region that is directly below the first metal silicide layer has a less concentration of the first dopants and of the second dopants than the first blocking region; and
   a second blocking region in a top portion of the semiconductor substrate, wherein the second blocking region comprises third dopants and fourth dopants, the third dopants are the same as the first dopants, the fourth dopants are the same as the second dopants, wherein
   the second blocking region is in the source region, and the first metal silicide layer over the source region is adjacent to and does not cover the second blocking region, or
   the second blocking region is in the drain region, and the first metal silicide layer over the drain region is adjacent to and does not cover the second blocking region.

2. The semiconductor device as claimed in claim 1, wherein the first dopants comprise germanium, and the second dopants comprise carbon.

3. The semiconductor device as claimed in claim 1, further comprising:
   a second metal silicide layer in the resistor and over the first blocking region, wherein a first thickness of the first metal silicide layer is greater than a second thickness of the second metal silicide layer.

4. The semiconductor device as claimed in claim 2, wherein a germanium concentration of the first blocking region ranges from about $1E13\ cm^{-3}$ to about $1E16\ cm^{-3}$.

5. The semiconductor device as claimed in claim 1, further comprising:
   an isolation structure in the semiconductor substrate, wherein the resistor is located over the isolation structure, and the second blocking region is adjacent to the isolation structure, wherein the semiconductor device further comprises:
   a third blocking region in a top portion of the isolation structure, wherein the third blocking region comprises fifth dopants and sixth dopants, the fifth dopants are the same as the first dopants, and the sixth dopants are the same as the second dopants, and the first metal silicide layer does not cover the third blocking region.

6. The semiconductor device as claimed in claim 5, wherein the third blocking region is adjacent to the resistor and between the resistor and the second blocking region, and the third blocking region is connected to the second blocking region.

7. The semiconductor device as claimed in claim 5, further comprising: a buffer layer covering the resistor.

8. The semiconductor device as claimed in claim 7, wherein the buffer layer further covers the second blocking region and the third blocking region.

9. The semiconductor device as claimed in claim 1, wherein the second blocking region is in direct contact with the first metal silicide layer.

10. A semiconductor device, comprising:
    a gate stack on a semiconductor substrate;
    a source region and a drain region in the semiconductor substrate and adjacent to the gate stack;
    a semiconductor element on the semiconductor substrate, wherein the semiconductor element comprises a silicon material;
    a first metal silicide layer in the gate stack, the source region, and the drain region; and
    a first blocking region in a top portion of the semiconductor element, wherein the first blocking region comprises first dopants and second dopants with an atomic radius smaller than that of the first dopants, and each of a top portion of the gate stack that is directly below the first metal silicide layer, a top portion of the source region that is directly below the first metal silicide layer, and a top portion of the drain region that is directly below the first metal silicide layer has a less concentration of the first dopants and of the second dopants than the first blocking region; and
    a second blocking region in a top portion of the semiconductor substrate, wherein the second blocking region comprises third dopants and fourth dopants, the third dopants are the same as the first dopants, the fourth dopants are the same as the second dopants, wherein
    the second blocking region is in the source region, and the first metal silicide layer over the source region is adjacent to and does not cover the second blocking region, or
    the second blocking region is in the drain region, and the first metal silicide layer over the drain region is adjacent to and does not cover the second blocking region.

11. The semiconductor device as claimed in claim 10, wherein the first dopants comprise germanium, and the second dopants comprise carbon.

12. The semiconductor device as claimed in claim 10, further comprising:
    a second metal silicide layer in the semiconductor element and over the first blocking region, wherein a first thickness of the first metal silicide layer is greater than a second thickness of the second metal silicide layer.

13. The semiconductor device as claimed in claim 11, wherein a germanium concentration of the first blocking region ranges from about $1E13\ cm^{-3}$ to about $1E16\ cm^{-3}$.

14. The semiconductor device as claimed in claim 10, further comprising:
    an isolation structure in the semiconductor substrate, wherein the semiconductor element is located over the isolation structure, and the second blocking region is adjacent to the isolation structure.

15. The semiconductor device as claimed in claim 14, further comprising:
    a third blocking region in a first top portion of the isolation structure, wherein the third blocking region is connected to the second blocking region, the third blocking region comprises fifth dopants and sixth dopants, the fifth dopants are the same as the first dopants, and the sixth dopants are the same as the second dopants.

16. The semiconductor device as claimed in claim 15, wherein the third blocking region is between the semiconductor element and the second blocking region.

17. The semiconductor device as claimed in claim 15, further comprising: a buffer layer covering the first blocking region, the second blocking region, and the third blocking region.

18. The semiconductor device as claimed in claim 10, wherein the second blocking region is in direct contact with the first metal silicide layer.

19. The semiconductor device as claimed in claim 15, further comprising:
   a spacer on a sidewall of the semiconductor element, wherein the spacer is between the first blocking region and the third blocking region.

20. The semiconductor device as claimed in claim 19, further comprising: a buffer layer covering the first blocking region, the second blocking region, the third blocking region, and the spacer.

* * * * *